(12) United States Patent
Suzuki

(10) Patent No.: US 7,589,366 B2
(45) Date of Patent: Sep. 15, 2009

(54) SOLID-STATE IMAGING DEVICE AND METHOD FOR MANUFACTURING THE SAME

(75) Inventor: Masakatsu Suzuki, Hirakata (JP)

(73) Assignee: Panasonic Corporation, Osaka (JP)

(*) Notice: Subject to any disclaimer, the term of this patent is extended or adjusted under 35 U.S.C. 154(b) by 231 days.

(21) Appl. No.: 11/315,114

(22) Filed: Dec. 22, 2005

(65) Prior Publication Data
US 2006/0138481 A1     Jun. 29, 2006

(30) Foreign Application Priority Data
Dec. 28, 2004   (JP) .............................. 2004-381017

(51) Int. Cl.
*H01L 31/109* (2006.01)
(52) U.S. Cl. .................. 257/294; 257/461; 257/463; 257/E31.067; 438/66; 438/527; 438/529
(58) Field of Classification Search ................. 257/294, 257/461, 463, E31.067; 438/66, 527, 529
See application file for complete search history.

(56) References Cited

U.S. PATENT DOCUMENTS 6,391,462 B1 * 5/2002 Jang ........................... 428/432
6,831,265 B2 * 12/2004 Yoneda et al. ............. 250/214 R
7,105,906 B1 * 9/2006 Hopper et al. ................ 257/440
2004/0251398 A1 * 12/2004 Mouli et al. ................ 250/214.1

FOREIGN PATENT DOCUMENTS

JP        6-163971        6/1994

* cited by examiner

*Primary Examiner*—Victor A Mandala
(74) *Attorney, Agent, or Firm*—Hamre, Schumann, Mueller & Larson, P.C.

(57) ABSTRACT

A solid-state imaging device includes a semiconductor substrate (1) with a photodetector portion (15). The photodetector portion (15) includes a p-type first impurity region (surface inversion layer) (6) formed in the semiconductor substrate (1) and an n-type second impurity region (photoelectric conversion region) (4) formed below the surface inversion layer (6). The photoelectric conversion region (4) is formed by introducing an n-type impurity into the semiconductor substrate (1). The surface inversion layer (6) is formed by introducing indium into a region of the semiconductor substrate (1) where the photoelectric conversion region (4) is formed.

7 Claims, 4 Drawing Sheets

SOLID-STATE IMAGING DEVICE AND METHOD FOR MANUFACTURING THE SAME

BACKGROUND OF THE INVENTION

1. Field of the Invention

The present invention relates to a solid-state imaging device and a method for manufacturing the same.

2. Description of Related Art

Nowadays, CCD (Charge Coupled Device) solid-state imaging devices using a CCD for reading out a signal charge are in the mainstream. Also, in solid-state imaging devices, as pixels become finer and finer, there is a considerable increase in the number of pixels and a significant reduction in the size of an imaging element.

In general, a solid-state imaging device used in a video camera, a digital still camera, or the like includes a photodetector portion (photodiode), a vertical transfer CCD portion (vertical CCD), and a horizontal transfer CCD portion (horizontal CCD), which are formed on a silicon substrate. The photodetector portion performs photoelectric conversion, and accumulates a signal charge in accordance with received light. The vertical transfer CCD portion reads out the signal charge accumulated in the photodetector portion, and transfers the same in a vertical direction. The horizontal transfer CCD portion (horizontal CCD) transfers the signal charge transferred by the vertical transfer CCD portion in a horizontal direction.

On the silicon substrate, a transfer gate electrode constituting the vertical transfer CCD portion or the horizontal transfer CCD portion is formed via an insulating film. Further, on the silicon substrate, there are an interlayer insulating film, a light-shielding film having an opening above the photodetector portion, and a surface protective film in this order. Further, a flattening film, a color filter, and a microlens are layered in this order, as necessary.

There are a plurality of the photodetector portions, which are arranged in a matrix in horizontal and vertical directions. The vertical transfer CCD portion is provided with respect to each vertical row of the photodetector portions so as to be in parallel with the row. In the case of interline transfer, the vertical row of the photodetector portions and the vertical transfer CCD portion are arranged alternately. One photodetector portion and a part of the vertical transfer CCD portion corresponding thereto that is adjacent to the photodetector portion constitutes a single pixel.

In this configuration, when a predetermined signal voltage is applied to the transfer gate electrode so as to drive the respective CCD portions, a signal change generated by the incidence of light on the photodetector portion is transferred to the vertical transfer CCD portion and the horizontal transfer CCD portion sequentially. The signal charge is output finally as an image signal from an output circuit connected with the horizontal CCD.

In some solid-state imaging devices, an output signal may be observed even when incident light is shielded completely. This is a kind of noise signals referred to as dark current or white flaws. Such a noise signal is known to increase exponentially with temperature.

At present, in general, a buried photodiode is used as a structure of the photodetector portion so as to suppress the generation of dark current and white flaws. A buried photodiode is configured as follows: a semiconductor region (surface inversion layer) having an inverse conductivity type is provided on a photoelectric conversion region (semiconductor region) formed on a silicon substrate.

The buried photodiode suppresses dark current and white flaws caused by an interface state between the photodiode and a surface oxide film (insulating film) or crystal defects formed in the vicinity of a surface of the photodiode by the surface inversion layer. The buried photodiode is manufactured in the following manner, for example. When the photodiode has an n-type surface (photoelectric conversion region), a p-type impurity (boron (B)) is ion-implanted in the surface to a shallow depth so as to form a p-type surface inversion layer. After the ion implantation, a heat treatment such as annealing is performed so as to repair crystal defects formed on the silicon substrate by the ion implantation. The buried photodiode manufactured in this manner allows a thermally excited electron to recombine with a hole formed of the p-type impurity, thereby reducing dark current and white flaws.

However, in the buried photodiode, when the impurity concentration on the uppermost surface is reduced due to variations in the concentration of the impurity during ion implantation, there is a decrease in the ability of the surface inversion layer to suppress dark current and white flaws. Further, when the dose of ion implantation for the surface inversion layer is increased so as to suppress a reduction in the impurity concentration on the uppermost surface, crystal defects on the silicon substrate are increased by the ion implantation when the dose of ion implantation exceeds an optimum level. As a result, the number of white flaws is increased again. Further, even when the dose of ion implantation for the surface inversion layer is optimum, the generation of white flaws cannot be reduced to a certain level or lower.

In order to solve the above-mentioned problems, JP 6(1994)-163971 A proposes a manufacturing method in which in forming a surface inversion layer, a layer having the same conductivity type as that of a conventional surface inversion layer and a higher impurity concentration than that of the conventional surface inversion layer is formed on a surface side of the conventional surface inversion layer. With the manufacturing method described in the above document, it is considered that a reduction in the impurity concentration on the uppermost surface due to variations of the impurity during ion implantation can be suppressed. Further, it is possible to suppress the formation of crystal defects on the silicon substrate during ion implantation, and accordingly an increase of crystal defects due to an increased dose of ion implantation can be suppressed. Further, it is considered that the generation of white flaws when the dose of ion implantation is optimum can be reduced further.

However, boron (B), which is ion-implanted for forming the surface inversion layer, is likely to be diffused by heat. Accordingly, when boron (B) is introduced during the formation of the surface inversion layer, the boron (B) is diffused toward the photoelectric conversion region by a heat treatment. Consequently, it is difficult to distribute the p-type impurity on the surface of the photodiode to a shallow depth in a concentrated manner. Moreover, the diffusion of boron (B) narrows the photoelectric conversion region.

For these reasons, according to conventional manufacturing methods including the one described in the above document, there is a small amount of donor produced by the photodiode, and it is impossible to increase the saturation electric charge (maximum storage electric charge).

Further, even with the manufacturing method described in the above document, it is impossible to suppress sufficiently an increase of crystal defects on the silicon substrate due to an increased dose of ion implantation. Further, it is also impossible to reduce sufficiently the generation of white flaws when the dose of ion implantation is optimum. Thus, it is required to suppress further the formation of crystal defects on the silicon substrate during ion implantation and to reduce further the generation of white flaws.

It is an object of the present invention to provide a solid-state imaging device that solves the above-mentioned problems, reduces the generation of dark current and white flaws as compared with conventional examples, and increases the saturation electric charge of a photodiode, and a method for manufacturing the same.

SUMMARY OF THE INVENTION

In order to achieve the above-mentioned object, a solid-state imaging device according to the present invention includes a semiconductor substrate with a photodetector portion, the photodetector portion including a p-type first impurity region formed in the semiconductor substrate and an n-type second impurity region formed below the first impurity region, wherein the first impurity region contains indium as an impurity.

Further, in order to achieve the above-mentioned object, a method according to the present invention is for manufacturing a solid-state imaging device including a semiconductor substrate with a photodetector portion, the photodetector portion including a p-type first impurity region formed in the semiconductor substrate and an n-type second impurity region formed below the first impurity region. The method includes the steps of: (a) forming the n-type second impurity region by introducing an n-type impurity into the semiconductor substrate; and (b) forming the p-type first impurity region by introducing indium into the semiconductor substrate.

As described above, according to the solid-state imaging device and the method for manufacturing the same of the present invention, the first impurity region to be a surface inversion layer of a buried photodiode contains indium as an impurity. Indium has a larger mass number and a lower diffusion coefficient than those of boron, which has been used to form a conventional surface inversion layer.

Therefore, in the first impurity region (surface inversion layer), a sharp impurity distribution can be maintained even after a heat treatment performed after ion implantation. Thus, according to the solid-state imaging device and the method for manufacturing the same of the present invention, it is possible to obtain a buried photodiode having the surface inversion layer in which the impurity is distributed on the surface of the photodiode to a shallow depth in a concentrated manner. As a result, it is possible to increase the saturation electric charge of the photodiode and to suppress the generation of dark current and white flaws, resulting in a solid-state imaging device with excellent quality of an output image as compared with a conventional solid-state imaging device.

In the case of introducing indium as an impurity, a region of the semiconductor substrate where indium has been introduced can be made amorphous, unlike the case of introducing boron. This is because indium has a much larger mass number than that of boron. Thus, when indium is introduced as an impurity, crystal defects can be repaired by a heat treatment such as annealing more readily than in the case where only boron is introduced. Consequently, according to the solid-state imaging device and the method for manufacturing the same of the present invention, it is possible to suppress effectively an increase of dark current and white flaws caused by crystal defects on the semiconductor substrate as compared with a conventional example.

BRIEF DESCRIPTION OF THE DRAWINGS

FIG. 2 is a cross-sectional view showing successive main steps in a method for manufacturing the solid-state imaging device according to Embodiment 1 of the present invention.

FIG. 3 is a cross-sectional view showing successive main steps in the method for manufacturing the solid-state imaging device according to Embodiment 1 of the present invention.

DETAILED DESCRIPTION OF THE INVENTION

Figure 1:
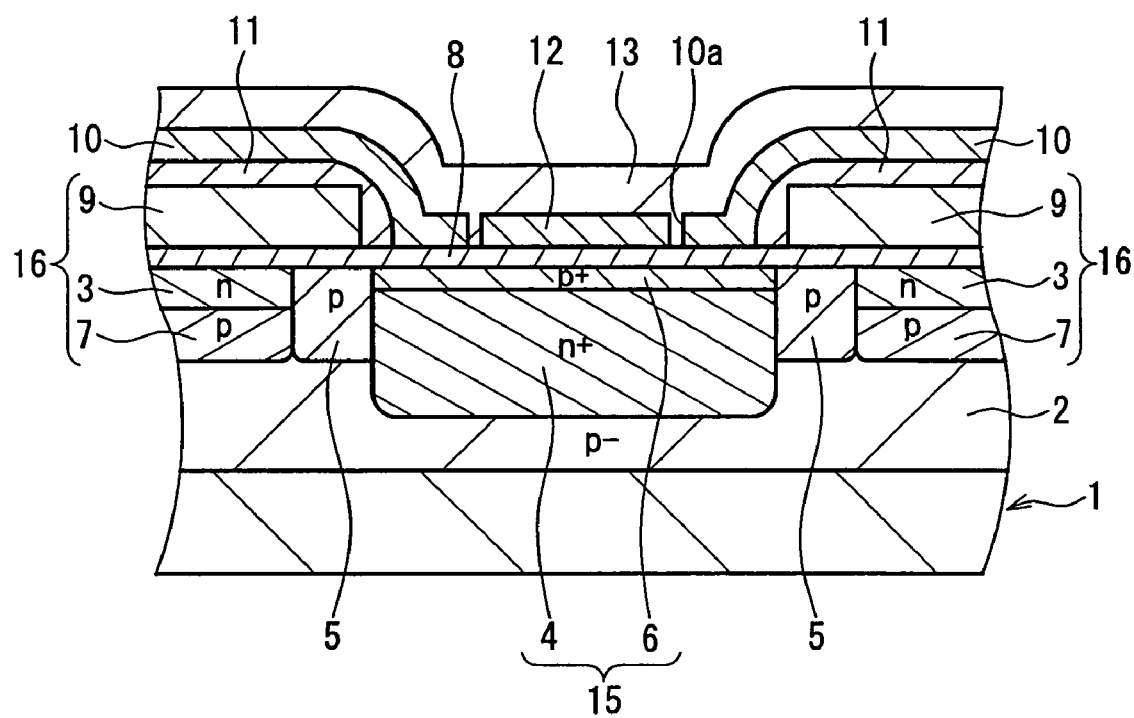
FIG. 1 is a cross-sectional view showing a configuration of a solid-state imaging device according to Embodiment 1 of the present invention.

A solid-state imaging device according to the present invention includes a semiconductor substrate with a photodetector portion, the photodetector portion including a p-type first impurity region formed in the semiconductor substrate and an n-type second impurity region formed below the first impurity region. The first impurity region contains indium as an impurity.

The activation energy of an acceptor level of boron and indium are 0.045 mV and 0.16 mV, respectively. Dark current and white flaws increase exponentially with temperature. Crystal defects, a metal impurity, and the like that cause dark current and white flaws have an energy level in the vicinity of the center of the band gap, and its activation energy is about 0.4 to 0.6 mV.

As mentioned above, although the acceptor level of indium is deeper than that of boron, it is sufficiently shallower than the energy level of crystal defects, a metal impurity, and the like that cause dark current and white flaws. Further, although the activation rate of indium at room temperature is lower than that of boron, it increases exponentially with temperature. Consequently, by introducing indium as an impurity into the first impurity region to be a surface inversion layer, the generation of white flaws due to a rise in temperature can be suppressed effectively.

In the solid-state imaging device according to the present invention, it is preferable that the semiconductor substrate is a silicon substrate, and the first impurity region further contains boron as the impurity. With this configuration, it is possible to suppress crystal distortion due to the introduction of the impurity, and the generation of dark current and white flaws caused thereby is reduced. As a result, the quality of an output image can be improved further.

More specifically, indium, boron, and silicon have an atomic radius of 1.44 Å (1.23), 0.88 Å (0.75), and 1.17 Å (1.00), respectively (numbers in parentheses described next to the respective atomic radiuses are ratios to the atomic radius of silicon). In the case where indium and boron are introduced into the silicon substrate, indium, whose atomic radius is larger than that of silicon, allows compressive stress to be applied to surrounding crystals. On the other hand, boron, whose atomic radius is smaller than that of silicon in this case, allows tensile stress to be applied to surrounding crystals.

Therefore, when boron is introduced in addition to indium as an impurity in the surface inversion layer of a buried photodiode, crystal distortion due to stress can be reduced as compared with the case where only indium is introduced or the case where only boron is introduced.

In the above-mentioned configuration, it is preferable that in the first impurity region, a ratio (N1/N) of an amount N1 of the indium to a total amount N of the indium and the boron is not less than 0.4 and not more than 0.6. When the ratio is set within this range, crystal distortion due to stress can be minimized, so that the generation of dark current and white flaws caused by crystal distortion can be reduced further.

A method according to the present invention is for manufacturing a solid-state imaging device including a semiconductor substrate with a photodetector portion, the photodetector portion including a p-type first impurity region formed in the semiconductor substrate and an n-type second impurity region formed below the first impurity region. The method includes the steps of: (a) forming the n-type second impurity region by introducing an n-type impurity into the semiconductor substrate; and (b) forming the p-type first impurity region by introducing indium into the semiconductor substrate.

In the method for manufacturing a solid-state imaging device according to the present invention, it is preferable that the semiconductor substrate is a silicon substrate, and in the step (b), the indium is introduced by ion implantation at a dose of not less than $5 \times 10^{13}$ (ions/cm$^2$). With this configuration, the reaction of making a region of the semiconductor substrate (silicon substrate) where indium has been introduced (ion-implanted) amorphous can be accelerated further, and thus crystal defects can be repaired by annealing more readily.

When boron, which has a small mass number, is ion-implanted, the reaction of making the semiconductor substrate amorphous does not occur. Thus, in order to repair crystal defects caused by the ion implantation, a heat treatment such as annealing has to be performed under a high-temperature condition of not less than 800° C. On the other hand, in the above-mentioned configuration, since the reaction of making the semiconductor substrate amorphous is accelerated, crystal defects can be repaired with merely a heat treatment such as annealing under a low-temperature condition of about 450° C. to 550° C. In this manner, with the above-mentioned configuration, the temperature for a heat treatment after the ion implantation can be made lower than that in a conventional example, and thus thermal diffusion of the impurity in the impurity region can be suppressed. As a result, the saturation electric charge of the photodiode can be increased further, whereby the quality of an output image can be improved further.

In the method for manufacturing a solid-state imaging device according to the present invention, it is preferable that the semiconductor substrate is a silicon substrate, and in the step (b), boron (B) is introduced further, and the indium and the boron are introduced by ion implantation. With this configuration, as described with respect to the solid-state imaging device, crystal distortion due to the introduction of the impurity can be suppressed. Accordingly, in the manufactured solid-state imaging device, dark current and white flaws caused by crystal distortion can be reduced, and thus the quality of an output image can be improved further.

In the above-mentioned configuration, it is preferable that the step (b) is performed so that a ratio (N1/IN) of an amount N1 of the indium (In) to a total amount N of the indium (In) and the boron (B) is not less than 0.4 and not more than 0.6 in the first impurity region. When the ratio is set within this range, as described with respect to the solid-state imaging device, crystal distortion due to stress is minimized, so that the generation of dark current and white flaws caused by crystal distortion can be reduced further.

In the above-mentioned configuration, it is preferable that in the step (b), the boron is ion-implanted after the indium is ion-implanted. In such a case, boron is ion-implanted after the semiconductor substrate has been made amorphous by the ion implantation of indium. Thus, as compared with the case where only boron is ion-implanted, the temperature for a heat treatment such as annealing after the ion implantation can be made lower. Thus, thermal diffusion of boron can be suppressed.

As a method for distributing boron to a shallow depth in a concentrated manner for the formation of a surface inversion layer of a buried photodiode, the following method has been known conventionally. That is, silicon is ion-implanted before ion implantation of boron, so that a surface of the silicon substrate is made amorphous beforehand. However, since silicon is not a p-type impurity, the dose of boron has to be set higher than that in the present invention for the formation of the surface inversion layer. As a result, although the temperature for a heat treatment can be reduced by making the substrate amorphous by the ion implantation of silicon, it is difficult to increase the saturation electric charge as compared with the present invention since a large amount of boron is thermally diffused.

Also in the case where boron is ion-implanted after the ion implantation of indium, it is preferable that the dose of indium is set to not less than $5 \times 10^{13}$ (ions/cm$^2$) as described above. In such a case, crystal defects can be repaired with merely a heat treatment such as annealing under a low-temperature condition of about 450° C. to 550° C. In the case of ion implantation of silicon, a dose of about $5 \times 10^{13}$ (ions/cm$^2$) is not sufficient for making the semiconductor substrate amorphous, and accordingly the dose of silicon has to be set considerably high as compared with the case of ion implantation of indium. As a result, the cost of performing ion implantation is high.

In the solid-state imaging device and the method for manufacturing the same according to the present invention, it is preferable that an antireflection film is formed above the photodetector portion, that is, above the first impurity region to be a surface inversion layer. In such a case, an optical loss of light incident on the photodetector portion can be suppressed. The antireflection film can include a silicon nitride film.

In the case of using a silicon nitride film as the antireflection film, it is preferable that the antireflection film contains indium as an impurity by performing ion implantation of indium therein. With this configuration, stress that may be caused in the silicon nitride film can be reduced, and thus dark current and white flaws caused by stress can be suppressed.

A silicon nitride film, which has a close-packed crystal structure, may have high stress therein. In such a case, stress concentration may be caused in a step portion and the like of the antireflection film formed of a silicon nitride film. If the surface of the semiconductor substrate comes under the influence of such stress concentration, white flaws may be caused. However, when indium is ion-implanted in the antireflection film, a bond in the silicon nitride film can be broken, so that stress in the silicon nitride film can be reduced.

The breaking of a bond in the silicon nitride film also can be performed by ion implantation of arsenic instead of indium. However, since arsenic is an n-type impurity, it may penetrate to the surface inversion layer of the buried photodiode depending on variations in the impurity concentration during the ion implantation. In such a case, the impurity concentration on the surface inversion layer of the photodiode is reduced, and there is a decrease in the ability of the surface inversion layer to suppress dark current and white flaws. On the other hand, indium, which is a p-type impurity, does not decrease the ability of the surface inversion layer to suppress dark current and white flaws even if it penetrates to the surface inversion layer of the buried photodiode.

Embodiment 1

Hereinafter, a solid-state imaging device and a method for manufacturing the same according to Embodiment 1 of the present invention will be described with reference to FIGS. 1 to 3. First, the configuration of the solid-state imaging device according to Embodiment 1 will be described. FIG. 1 is a cross-sectional view showing the configuration of the solid-state imaging device according to Embodiment 1 of the present invention. Note here that FIG. 1 shows a part of the solid-state imaging device, or specifically a single pixel out of a plurality of pixels constituting the device. The single pixel includes a photodetector portion 15 and a vertical CCD portion 16. A plurality of the pixels are arranged two-dimensionally (in a matrix) to constitute the solid-state imaging device.

As shown in FIG. 1, the solid-state imaging device according to Embodiment 1 includes a semiconductor substrate 1 with the photodetector portion 15. The photodetector portion 15 is a buried photodiode. The photodetector portion 15 includes a p-type first impurity region 6 formed in the semiconductor substrate 1 and an n-type second impurity region 4 formed below the first impurity region 6.

The first impurity region 6 is a surface inversion layer formed so as to reduce effects of dark current and white flaws caused by an interface state (Si/SiO$_2$ interface state) between the photodetector portion 15 and a surface oxide film (insulating film 8) or crystal defects formed in the vicinity of a surface of the photodetector portion 15. The second impurity region 4 is a photoelectric conversion region of the photodiode. In the description below, these regions are referred to as a "surface inversion layer 6" and a "photoelectric conversion region 4", respectively.

In Embodiment 1, the semiconductor substrate 1 is an n-type silicon substrate. As shown in FIG. 1, the semiconductor substrate 1 includes the vertical CCD portion 16. Although not shown in the figure, the semiconductor substrate 1 also includes a horizontal CCD portion (not shown). The insulating film 8 is formed on a surface of the semiconductor substrate 1. In Embodiment 1, the insulating film 8 is a silicon oxide film (SiO$_2$ film). In the semiconductor substrate 1, a p-type well 2 is formed, and the photodetector portion 15 and the vertical CCD portion 16 are formed in a region where the p-type well 2 is formed.

The vertical CCD portion 16 includes a p-type region 7, an n-type region 3 formed on the p-type region 7, and a transfer gate electrode 9 provided via the insulating film 8. A part of the insulating film 8 functions as a gate insulating film of the transfer gate electrode 9. The n-type region 3 is a buried channel of the vertical CCD portion 16. In Embodiment 1, the transfer gate electrode 9 is formed of polysilicon. Further, the transfer gate electrode 9 is covered with an interlayer insulating film 11.

FIG. 1 shows two vertical CCD portions 16, one of which is used to read out a charge accumulated in the photodetector portion 15 and the other of which is used to read out a charge accumulated in another photodetector portion not shown. Further, as shown in FIG. 1, in a region between each vertical CCD portion 16 and the photodetector portion 15 in the semiconductor substrate 1, a p-type region 5 for element isolation is formed.

Further, as shown in FIG. 1, on the semiconductor substrate 1, a light-shielding film 10 having an opening portion 10a above the photodetector portion 15 is provided so as to allow light to be incident only on the photodetector portion 15. In Embodiment 1, the light-shielding film 10 is formed of tungsten (W). In a region inside the opening portion 10a above the photodetector portion 15, an antireflection film 12 is formed. The antireflection film 12 suppresses an optical loss of light incident on the Si/SiO$_2$ interface. In Embodiment 1, the antireflection film 12 is a silicon nitride film (SiN). Further, in Embodiment 1, a surface protective film 13 also is formed so as to cover the solid-state imaging device entirely.

As described above, the solid-state imaging device according to Embodiment 1 has the photodetector portion 15 and the vertical CCD portion 16, the photodetector portion 15 including the photoelectric conversion region 4 and the surface inversion layer 6, like a conventional solid-state imaging device. However, in Embodiment 1, the surface inversion layer 6 contains indium (In) as an impurity in contrast to a surface inversion layer of a conventional solid-state imaging device that contains only boron (B) as an impurity. Indium (In) has a larger mass number and a lower diffusion coefficient than those of boron (B).

Due to the above characteristics of indium, in the surface inversion layer 6, a sharp impurity distribution is maintained even after a heat treatment performed after ion implantation as compared with a conventional surface inversion layer, and the impurity is distributed on the surface of the photodiode to a shallow depth in a concentrated manner. Consequently, according to the solid-state imaging device of Embodiment 1, the saturation electric charge of the photodetector portion (photodiode) 15 can be increased, whereby the quality of an output image can be improved as compared with a conventional solid-state imaging device.

Next, a method for manufacturing the solid-state imaging device according to Embodiment 1 shown in FIG. 1 will be described with reference to FIGS. 2 and 3. FIGS. 2 and 3 are cross-sectional views showing successive main steps in the method for manufacturing the solid-state imaging device according to Embodiment 1 of the present invention. FIGS. 2A to 2D show a series of the main steps, and FIGS. 3A to 3D show a series of the main steps subsequent to the step shown in FIG. 2D. In FIGS. 2 and 3, only lines appearing on the cross section are shown.

Figure 2A:
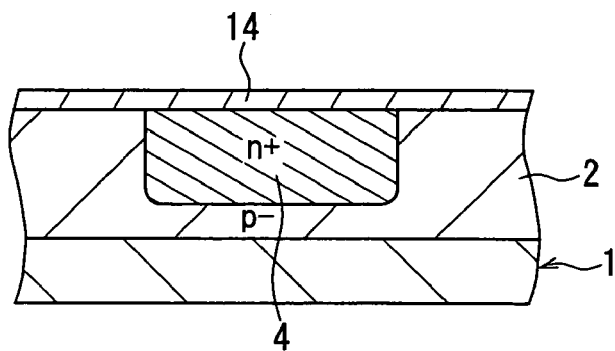
FIGS. 2A to 2D show a series of the main steps.

Initially, as shown in FIG. 2A, a silicon nitride film (SiN) to be a protective oxide film 14 is formed on the surface of the semiconductor substrate (n-type silicon substrate) 1, and boron (B) is ion-implanted from above the silicon nitride film so as to form a p-type well 2. Further, a resist pattern (not shown) appropriate for the formation of the photoelectric conversion region 4 is formed, followed by ion implantation of arsenic (As), whereby the photoelectric conversion region 4 is formed. The ion implantation of arsenic (As) is performed with an acceleration energy of 550 Kev and a dose of $2.6 \times 10^{12}$ ions/cm$^2$, for example. Thereafter, the resist pattern is removed, and the semiconductor substrate is annealed in a nitrogen atmosphere at a temperature of 900° C. to 1100° C., particularly 1000° C., for 30 seconds to 40 minutes, particularly 20 minutes, for example.

Figure 2B:
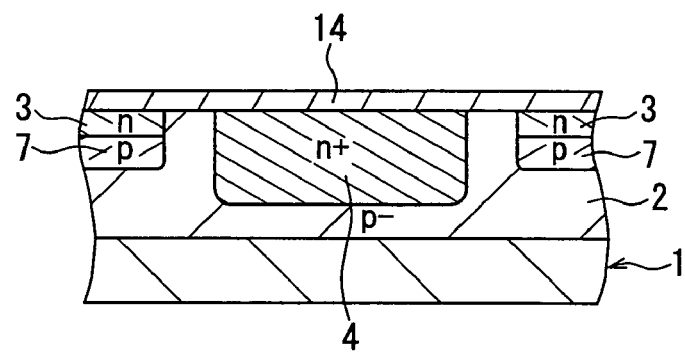

Then, as shown in FIG. 2B, a resist pattern (not shown) appropriate for the formation of the n-type region 3 to a the buried channel is formed, followed by ion implantation of boron (B) and arsenic (As) in this order. As a result, the p-type region 7 and the n-type region 3 to be a buried channel are formed. Thereafter, the resist pattern is removed.

Figure 2C:
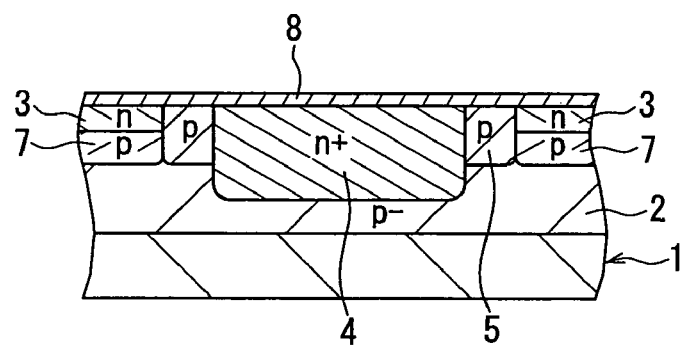

Then, as shown in FIG. 2C, after removing the protective oxide film 14, the insulating film 8 formed of a silicon oxide film ($SiO_2$) with a thickness of about 30 nm is formed on the surface of the semiconductor substrate 1 by performing a thermal oxidation method. Further, a resist pattern (not shown) appropriate for the formation of the p-type region 5 for element isolation is formed, followed by ion implantation of boron (B), whereby the p-type region 5 is formed. As a result, the photoelectric conversion region 4 to be the photodetector portion 15 and the n-type region 3 to be a buried channel of the vertical CCD portion 16 are isolated from each other by the p-type region 5. Thereafter, the resist pattern is removed.

Figure 2D:
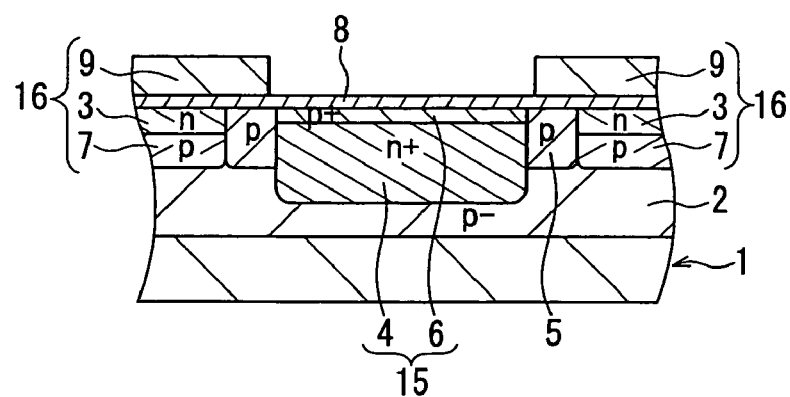

Then, as shown in FIG. 2D, a polysilicon film (250 nm) is grown by a CVD (chemical vapor deposition) method, and is formed into the transfer gate electrode 9 by dry etching. Further, indium (In) is ion-implanted with the transfer gate electrode 9 as a mask, whereby the p-type surface inversion layer 6 is formed on the surface of the photoelectric conversion region 4.

It is preferable that the ion implantation of indium (In) in this step is performed with an acceleration energy of 50 Kev and a dose of not less than $5 \times 10^{13}$ ions/cm$^2$, particularly $1 \times 10^{14}$ ions/cm$^2$, for example. The ion implantation of indium preferably is performed at a dose of not less than $5 \times 10^{13}$ ions/cm$^2$ so as to accelerate the reaction of making an ion-implanted region of the semiconductor substrate (silicon substrate) 1 amorphous, whereby crystal defects can be repaired by subsequent annealing more readily.

After that, annealing is performed in a nitride atmosphere. In this step, indium has been ion-implanted, and silicon has been made amorphous in the ion-implanted region. Thus, the annealing temperature in this step may be lower than that in other steps where boron is ion-implanted. In this step, annealing can be performed at a temperature of 450° C. to 550° C. for 20 minutes, for example. In this manner, since the annealing temperature can be set low, thermal diffusion of the impurity in the surface inversion layer 6 can be suppressed.

Figure 3A:
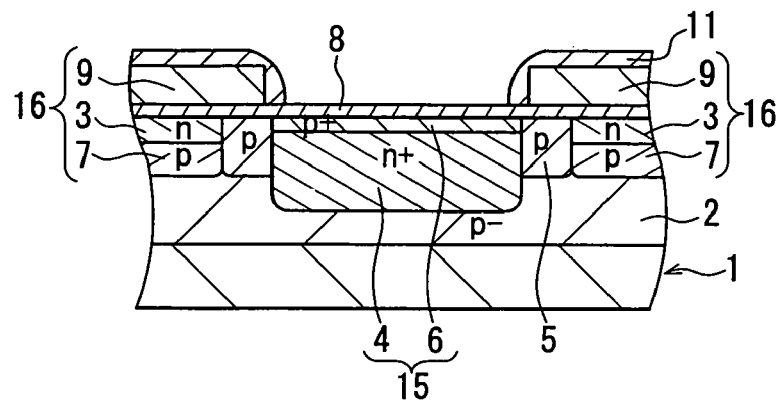
FIGS. 3A to 3D show a series of the main steps subsequent to the step shown in FIG. 2D.
Figure 3B:
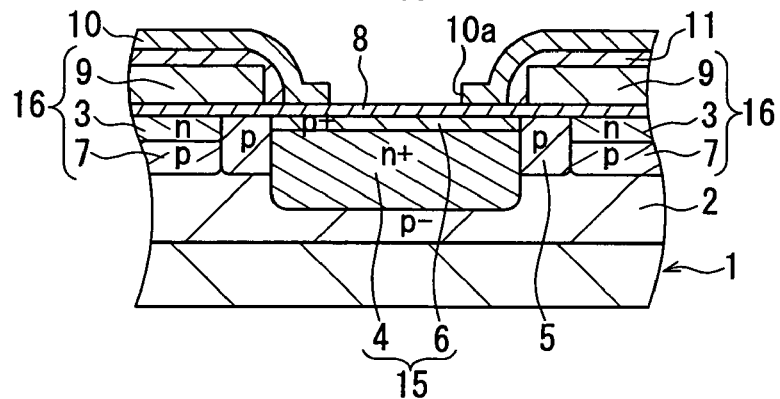

Then, as shown in FIG. 3A, the transfer gate electrode 9 is covered with the interlayer insulating film 11 formed of a silicon oxide film ($SiO_2$) by performing a thermal oxidation method. After that, as shown in FIG. 3B, a tungsten (W) film with a thickness of 200 nm is formed by a sputtering method, and then a portion above the photodetector portion 15 that is to be opened is removed by dry etching. As a result, the light-shielding film 10 having the opening portion 10a above the photodetector portion 15 is formed.

Figure 3C:
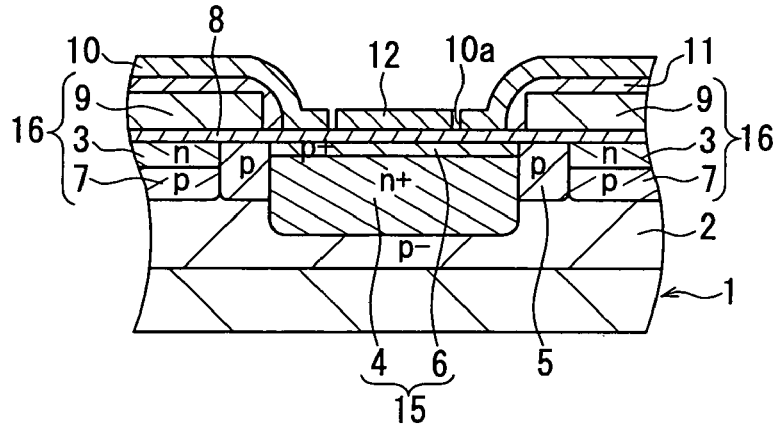

Then, as shown in FIG. 3C, a silicon nitride film with a thickness of 60 nm is formed by a low pressure CVD method, and then the silicon nitride film other than that in the opening portion 10a is removed by a wet etching method. As a result, the antireflection film 12 is formed inside the opening portion 10a.

The etching method for forming the antireflection film 12 is not particularly limited, and a dry etching method may be used instead of a wet etching method. In the example shown in FIGS. 1, 3C, and 3D, the antireflection film 12 is formed only above the photodetector portion 15. However, the present invention is not limited thereto, and the antireflection film 12 also may be formed so as to extend above or below the transfer gate electrode 9 or so as to cover the light-shielding film 10, for example.

Figure 3D:
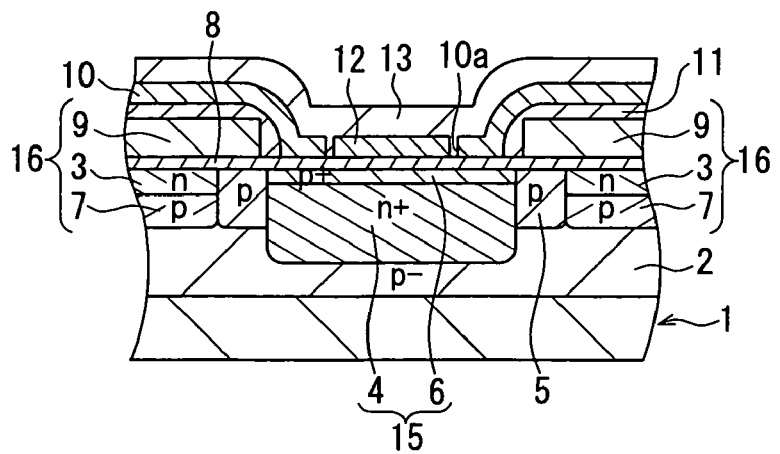

Then, as shown in FIG. 3D, the surface protective film 13 is formed so as to cover the entire surface of the semiconductor substrate 1 by a CVD method. The surface protective film 13 may be a silicon oxide film ($SiO_2$). The solid-state imaging device shown in FIG. 1 is obtained by performing the steps of FIGS. 2A to 3D.

Figure 4:
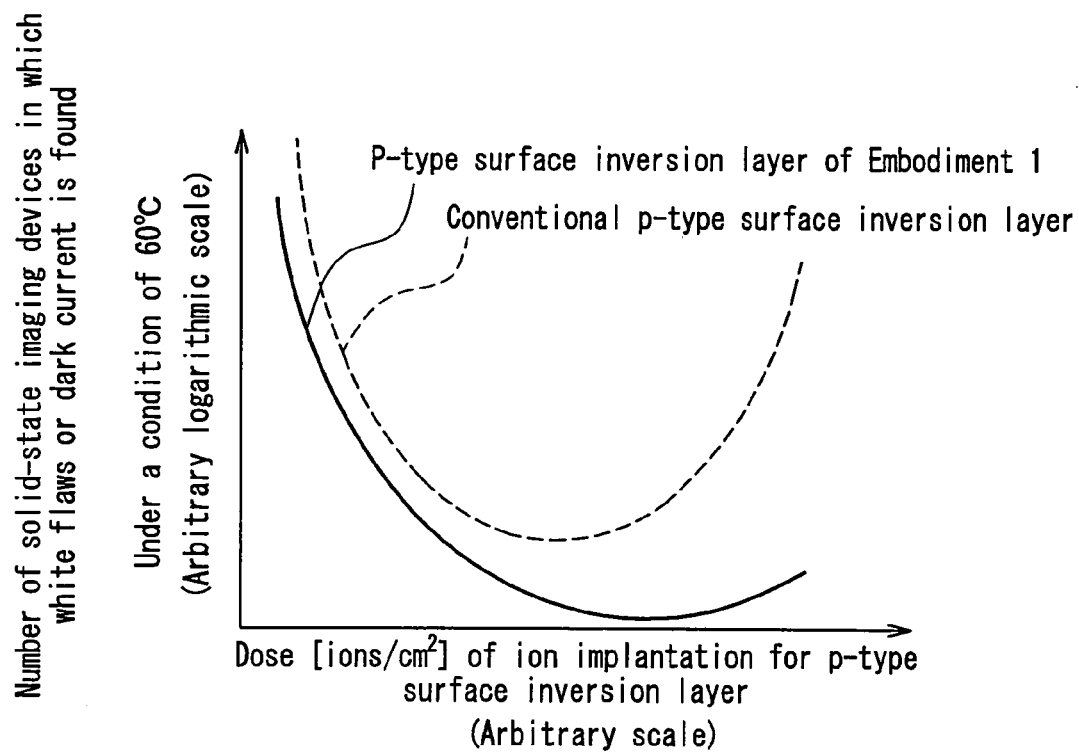
FIG. 4 is a diagram showing the relationship between the number of solid-state imaging devices in which white flaws or dark current is found and the dose of ion implantation for forming a surface inversion layer.
Figure 5:
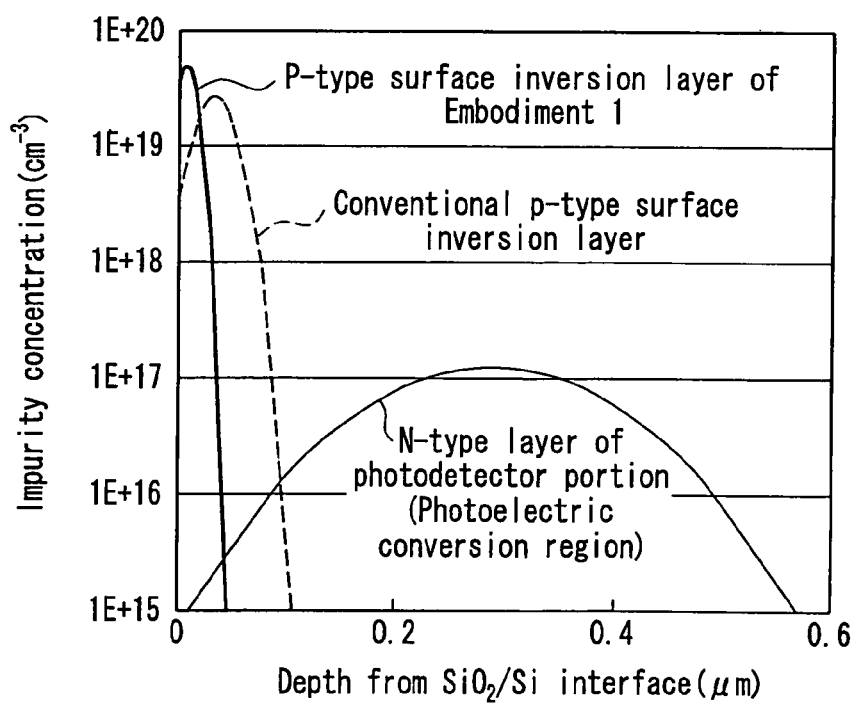
FIG. 5 is a diagram showing an impurity concentration distribution in a photodetector portion of the solid-state imaging device according to Embodiment 1 of the present invention.

The performance of the solid-state imaging device according to Embodiment 1 is evaluated with reference to FIGS. 4 and 5. First, with respect to an output screen of the solid-state imaging device according to Embodiment 1 shown in FIG. 1 and an output screen of a conventional solid-state imaging device, white flaws and dark current generated on these screens were measured under a condition of 60° C. As the conventional solid-state imaging device, one having a p-type surface inversion layer formed by ion implantation of boron (B) was used. In the conventional solid-state imaging device, ion implantation of boron for forming the surface inversion layer is performed with an acceleration energy of 10 Kev and a dose of $1 \times 10^{14}$ ions/cm$^2$.

As a result, on the output screen of the conventional solid-state imaging device, white flaws were found in 5 pixels out of 3,000,000 pixels, and the dark current was 1 mV on average. On the other hand, in the solid-state imaging device according to Embodiment 1, no white flaw was found, and the dark current was 0.5 mV on average. From this result, it is confirmed that according to Embodiment 1, it is possible to reduce white flaws and dark current as compared with the conventional example.

FIG. 4 is a diagram showing the relationship between the number of solid-state imaging devices in which white flaws or dark current is found and the dose [ions/cm$^2$] of ion implantation for forming the surface inversion layer. The number of solid-state imaging devices in which white flaws or dark current is found represent the number of solid-state imaging devices that meet at least one of the conditions that white flaws are generated and that a dark current is not less than 1 mV under the condition of 60° C.

A broken line in FIG. 4 indicates the conventional solid-state imaging device having a p-type surface inversion layer formed by ion implantation of boron (B). A solid line in FIG. 4 indicates the solid-state imaging device according to Embodiment 1 having the p-type surface inversion layer formed by ion implantation of indium (In).

As seen from FIG. 4, in the case of the conventional solid-state imaging device having the surface inversion layer formed by ion implantation of boron (B), the number of defective solid-state imaging devices increases with the dose of ion implantation when the dose of ion implantation exceeds a predetermined level. The reason for this is that crystal defects on the silicon substrate are increased when the dose of ion implantation exceeds the predetermined level.

On the other hand, in the case of the solid-state imaging device according to Embodiment 1 having the surface inversion layer formed by ion implantation of indium (In), the number of defective solid-state imaging devices still decreases even when the dose of ion implantation exceeds the level at which the number of defective solid-state imaging devices begins to increase in the conventional example. Further, in Embodiment 1 in which indium (In) is ion-implanted, the number of defective solid-state imaging devices decreases with the increase in the dose of ion implantation more remarkably than in the conventional example.

The reason for the above-mentioned results is that in the case where indium (In) is introduced as an impurity, crystal defects can be repaired by a heat treatment such as annealing more readily than in the case where only boron (B) is introduced. Consequently, according to Embodiment 1, it is possible to suppress an increase of crystal defects on the semiconductor substrate due to an increased dose of ion implantation and to reduce the generation of white flaws as compared with the conventional example.

FIG. 5 is a diagram showing an impurity concentration distribution in the photodetector portion of the solid-state imaging device according to Embodiment 1 of the present invention. FIG. 5 also shows an impurity concentration distribution in a surface inversion layer of a photodetector portion of the conventional solid-state imaging device. The broken line in FIG. 5 indicates the impurity concentration distribution in the surface inversion layer formed by ion implantation of boron (B) in the conventional solid-state imaging device. The solid line in FIG. 5 indicates the impurity concentration distribution in the photodetector portion of the solid-state imaging device according to Embodiment 1 having the surface inversion layer formed by ion implantation of indium (In).

As shown in FIG. 5, in the surface inversion layer obtained in Embodiment 1, the impurity is distributed on the surface of the photodetector portion to a shallow depth in a concentrated manner as compared with the conventional surface inversion layer formed by ion implantation of only boron (B). Therefore, according to Embodiment 1, it is possible to reduce the generation of dark current and white flaws caused by an interface state or crystal defects formed by ion implantation, and to suppress a decrease in the saturation electric charge of the photodiode. Consequently, the solid-state imaging device according to Embodiment 1 can improve the quality of an output image as compared with the conventional solid-state imaging device.

Embodiment 2

Next, a solid-state imaging device and a method for manufacturing the same according to Embodiment 2 of the present invention will be described. The solid-state imaging device and the method for manufacturing the same according to Embodiment 2 are the same as those in Embodiment 1 except for the following. In the description below, FIGS. 1 to 3 as shown in Embodiment 1 are referred to as appropriate.

In the solid-state imaging device according to Embodiment 2, the surface inversion layer 6 located above the photoelectric conversion region (n-type region) 4 that constitutes the photodetector portion 15 also contains boron (B) in addition to indium (In) as an impurity. Accordingly, in the step shown in FIG. 2D, indium and boron are ion-implanted.

Consequently, according to Embodiment 2, it is possible to suppress crystal distortion due to stress caused on the surface inversion layer 6 and to reduce the generation of dark current and white flaws caused thereby. As a result, according to Embodiment 2, the quality of an output image can be improved further as compared with Embodiment 1.

In Embodiment 2, it is preferable that the ratio (N1/N) of an amount (impurity concentration) of indium (In) N1 [atoms/cm$^3$] to a total amount (impurity concentration) of indium and boron (B) N [atoms/cm$^3$] in the surface inversion layer 6 is not less than 0.4 and not more than 0.6. When the ratio is set within this range, crystal distortion due to stress is minimized, so that the generation of dark current and white flaws caused by crystal distortion can be reduced further.

In Embodiment 2, the ratio (N1/N) can be set by adjusting the doses of ion implantation of indium (In) and boron (B), respectively. For example, the doses of indium (In) and boron (B) are adjusted respectively so that the ratio of a dose of indium (In) to a total dose of indium (In) and boron (B) becomes a desired ratio (N1/N). In this case, the respective doses can be corrected in consideration of the diffusion coefficient of the impurities. The determination as to whether or not the ratio (N1/N) is within the range of 0.4 to 0.6 can be made by examining the impurity concentration distribution using a Secondary Ion Mass Spectrometry (SIMS) method, for example.

In Embodiment 2, it is preferable that the ion implantation of indium (In) is performed with an acceleration energy of 50 Kev and a dose of not less than $5 \times 10^{13}$ ions/cm$^2$, particularly $1 \times 10^{14}$ ions/cm$^2$, for example, for the same reason as in Embodiment 1. Further, it is preferable that the ion implantation of boron (B) is performed with an acceleration energy of 10 Kev and a dose of $5 \times 10^{13}$ ions/cm$^2$, for example.

Further, in Embodiment 2, it is preferable that boron (B) is ion-implanted after the ion implantation of indium (In). In this case, boron (B) is ion-implanted after the semiconductor substrate has been made amorphous by the ion implantation of indium (In). As a result, as compared with the case where only boron (B) is ion-implanted, the temperature for a heat treatment such as annealing performed after the ion implantation can be made lower, and thus thermal diffusion of boron (B) can be suppressed.

With respect to an output screen of the solid-state imaging device according to Embodiment 2, white flaws and dark current generated on the output screen were measured under a condition of 60° C. As a result, no white flaw was found as in the solid-state imaging device of Embodiment 1. Further, the dark current was 0.5 mV. From this result, it is confirmed that white flaws and dark current can be reduced as compared with the conventional example in Embodiment 2 also.

Embodiment 3

Next, a solid-state imaging device and a method for manufacturing the same according to Embodiment 3 of the present invention will be described. The solid-state imaging device and the method for manufacturing the same according to Embodiment 3 are the same as those in Embodiment 1 except for the following. In the description below, FIGS. 1 to 3 as shown in Embodiment 1 are referred to as appropriate.

In the solid-state imaging device according to Embodiment 3, the antireflection film 12 formed of a silicon nitride film (SiN) contains indium (In) as an impurity. Accordingly, in the step shown in FIG. 3C, after the formation of the silicon nitride film (SiN) to be the antireflection film 12, indium (In) is ion-implanted in the silicon nitride film (SiN). Thereafter, the silicon nitride film other than that in the opening portion 10a of the light-shielding film 10 is removed by a wet etching or dry etching method.

As described above, in Embodiment 3, since indium (In) is introduced as an impurity into the antireflection film 12, internal stress, which may be caused by the crystal structure of the silicon nitride film, can be reduced. Therefore, it is possible to suppress the generation of dark current and white flaws caused by internal stress.

It is preferable that the ion implantation of indium (In) is performed so as not to allow indium (In) to penetrate the antireflection film 12 to the semiconductor substrate 1. The reason for this is that when indium (In) penetrates the antireflection film 12, internal stress caused on the antireflection film 12 may not be reduced sufficiently. In view of this, the ion implantation of indium (In) in the silicon nitride film (SiN) to be the antireflection film 12 is performed with an acceleration energy of 10 Kev and a dose of $1 \times 10^{14}$ ions/cm$^2$, for example.

If indium (In) penetrates the antireflection film 12 to the semiconductor substrate 1, although the effect of reducing internal stress on the antireflection film 12 is reduced, the impurity concentration in the vicinity of the surface of the p-type surface inversion layer 6 is increased. Thus, there is no adverse effect on the surface inversion layer but there is an increased effect of suppressing an influence of an $Si/SiO_2$ interface state.

With respect to an output screen of the solid-state imaging device according to Embodiment 3, white flaws and dark current generated on the output screen were measured under a condition of 60° C. As a result, no white flaw was found as in the solid-state imaging device of Embodiment 1. Further, the dark current was 0.3 mV. From this result, it is confirmed that white flaws and dark current can be reduced as compared with the conventional example also in Embodiment 3.

In Embodiments 1 to 3 above, the description is given taking as an example the case where the n-type silicon substrate 1 is used as the semiconductor substrate 1. However, the present invention is not limited thereto, and a p-type silicon substrate can be used as the semiconductor substrate 1. When a p-type silicon substrate is used as the semiconductor substrate 1, there is no need to form the p-type well 2 shown in FIG. 1 in the semiconductor substrate 1, and a semiconductor region of the p-type silicon substrate can be used as a p-type well.

Further, in Embodiments 1 to 3 above, the description is given taking a CCD solid-state imaging device as an example of the solid-state imaging device. However, the present invention is not limited thereto, and the solid-state imaging device according to the present invention may be an MOS solid-state imaging device or a solid-state imaging device other than these.

According to the present invention, it is possible to obtain a solid-state imaging device that achieves an excellent quality output image and a large saturation electric charge. This solid-state imaging device has industrial applicability of being useful for a video camera, a digital still camera, or the like.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for manufacturing a solid-state imaging device including a semiconductor substrate with a photodetector portion, the photodetector portion including a p-type first impurity region formed in the semiconductor substrate and an n-type second impurity region formed below the first impurity region, the method comprising the steps of:
   (a) forming the n-type second impurity region by introducing an n-type impurity into the semiconductor substrate,
   (b) forming the p-type first impurity region by introducing indium into the semiconductor substrate,
   (c) forming an antireflection film from a silicon nitride film above the photodetector portion; and
   (d) performing ion implantation of indium in the antireflection film,
   wherein in the step (b), boron is ion-implanted after the indium is ion-implanted.

2. The method for manufacturing a solid-state imaging device according to claim 1,
   wherein the semiconductor substrate is a silicon substrate, and
   in the step (b), the indium is introduced by ion implantation at a dose of not less than $5\times10^{13}$ (ions/cm$^2$).

3. The method for manufacturing a solid-state imaging device according to claim 1, wherein the step (b) is followed by a step of subjecting the semiconductor substrate to a heat treatment under a condition of 450° C. to 550° C.

4. The method for manufacturing a solid-state imaging device according to claim 1,
   wherein in the step (b), boron is introduced further, and the indium and the boron are introduced by ion implantation.

5. The method for manufacturing a solid-state imaging device according to claim 4,
   wherein the step (b) is performed so that a ratio (N1/N) of an amount N1 of the indium to a total amount N of the indium and the boron is not less than 0.4 and not more than 0.6.

6. A solid-state imaging device comprising a semiconductor substrate with a photodetector portion, the photodetector portion including a p-type first impurity region formed in the semiconductor substrate and an n-type second impurity region formed below the first impurity region and an antireflection film formed above the photodetector portion,
   wherein the first impurity region contains indium as an impurity and the antireflection film comprises a silicon nitride film and contains indium as an impurity, and
   wherein the first impurity region contains boron as an impurity.

7. The solid-state imaging device according to claim 6,
   wherein a ratio (N1/N) of an amount N1 of the indium to a total amount N of the indium and the boron is not less than 0.4 and not more than 0.6.

* * * * *